United States Patent
Hwang et al.

(10) Patent No.: US 7,064,157 B2
(45) Date of Patent: *Jun. 20, 2006

(54) FLAME RETARDANT RESIN AND FLAME RETARDANT COMPOSITION CONTAINING THE SAME

(75) Inventors: Kuen Yuan Hwang, Hsinchu (TW); Hong-Hsing Chen, Hsinchu (TW); An Pang Tu, Hsinchu (TW); Huan-Chang Chao, Hsinchu (TW)

(73) Assignee: Chang Chun Plastics Co., Ltd. (TW)

( * ) Notice: Subject to any disclaimer, the term of this patent is extended or adjusted under 35 U.S.C. 154(b) by 34 days.

This patent is subject to a terminal disclaimer.

(21) Appl. No.: 09/794,835

(22) Filed: Feb. 27, 2001

(65) Prior Publication Data

US 2002/0032279 A1    Mar. 14, 2002

(30) Foreign Application Priority Data

Jul. 19, 2000  (TW)  ................................ 89114433 A

(51) Int. Cl.
*C08L 63/10* (2006.01)
*C08L 63/00* (2006.01)
*C08G 79/06* (2006.01)

(52) U.S. Cl. ..................... 523/435; 523/427; 523/428; 523/429; 523/433; 523/445; 523/451; 523/461; 525/525; 528/106; 528/398

(58) Field of Classification Search ................ 549/512, 549/517, 553, 555, 562

See application file for complete search history.

(56) References Cited

U.S. PATENT DOCUMENTS

| 4,973,631 A | 11/1990 | McGrath et al. |
| 5,086,156 A | 2/1992 | McGrath et al. |
| 5,376,453 A | 12/1994 | von Gentzkow et al. |
| 5,458,978 A | 10/1995 | Bottcher et al. |
| 6,291,626 B1 * | 9/2001 | Wang et al. ................... 528/99 |
| 6,576,690 B1 * | 6/2003 | Hwang et al. ............... 523/466 |
| 6,797,821 B1 * | 9/2004 | Wang et al. ................. 544/195 |

* cited by examiner

*Primary Examiner*—Michael J. Feely
(74) *Attorney, Agent, or Firm*—Peter F. Corless; John B. Alexander; Edwards Angell Palmer & Dodge LLP

(57) ABSTRACT

The present invention relates to a phosphorus-containing epoxy resin, which is an epoxy resin modified with a side chain having a reactive phosphorus-containing compound. Also, the present invention relates to a flame-retardant resin composition, which comprises:

(1) the phosphorus-containing epoxy resin,
(2) a halogen-free hardener having a reactive hydrogen capable of reacting with the epoxy group in epoxy resin, and
(3) a hardener promoter.

The flame-retardant resin composition described above has improved excellent heat resistance and flame retardant property, and is especially suitable for adhesive laminates, composite materials, printed circuit boards, adhesive material for copper foils, and is suitable for IC packaging materials.

20 Claims, No Drawings

FLAME RETARDANT RESIN AND FLAME RETARDANT COMPOSITION CONTAINING THE SAME

BACKGROUND OF THE INVENTION

1. Field of the Invention

The present invention relates to flame-retardant epoxy resins, and more particularly to a flame-retardant epoxy resin modified by a reactive phosphorus-containing compound.

2. Background of the Invention

Conventional flame retardant compositions are generally added with flame retardant materials such as halogen-containing compounds or antimony- or vanadium-containing oxides to form high heat resistant compositions. The use of these materials, however, often causes serious environmental pollution problems.

In the application of composite materials, as for example in coating, electrical insulation, construction, building materials, adhesives or laminated products, epoxy resin composite materials are currently frequently used. Because of easy processing, high safety, excellent mechanical and chemical properties, epoxy resins have been widely used in many fields, and especially in the manufacture of laminated plates. Also, because epoxy resins have strong adhesion to reinforcement materials (such as glass-fiber fabrics), no volatility matters, and small shrinkage of the product while hardening, laminated plates produced by such resins have been massively applied to electrical and electronic products or components. However, in order to prevent the products or components from deterioration caused by the elevated temperature during process or use, additives such as, for example, halogen compounds, phosphorus compounds or oxides of antimony, vanadium, etc., are generally added to increase the heat resistance of the epoxy resins.

In the current significant process of the printed circuit board, the laminated plates are required to have excellent electrical properties, mechanical properties, and heat resistant processing properties, in addition there is increased demand for finer patterns on the circuit board. For example, FR4 laminated plates, which are widely used, have a glass transition temperature of about 130° C. after hardening. For the process of the printed circuit board, the temperature is over 200° C. during cutting and drilling, and even reaches over 270° C. during welding. Thus the laminated plates may break or crack during manufacture. In addition, for the laminated plates of printed circuit boards, another important property is flame retardancy. In some applications, such as airplanes, automobiles, and public transportation, the flame retardant property of the printed circuit board is absolutely necessary.

In order to impart a flame retardant property to laminated plates, substances that separate the flame and decrease burning are introduced. For the laminated plates of epoxy resin/glass-fiber systems (or organic fiber), halogen-containing compounds, especially bromine-containing epoxy resins, and hardeners are used in combination with flame retardant material such as antimonous acid anhydride, etc., so that the achievement of flame retardant standards (as strict as the UL94V-0 level) in the laminated plates can be attained. The flame retarding substance in epoxy resin usually contains up to 17% to 21% of bromine and is used in combination with antimonous acid anhydride or other retardants to achieve the standard of UL 94V-0. However, the use of high contents of bromine in epoxy resin or antimonous acid anhydride will adversely affect the health of human body. As well, bromine not only generates erosive free radicals and hydrogen bromide when it burns, aromatic compounds with high bromine contents also produce toxic brominated furans and a brominated dioxine compound during the burning process. Thus, since both human health and the environment are seriously affected, it is necessary to find a novel flame retardant material and a flame retardant property to solve the pollution and environmental problems caused by the current use of laminated products or components containing bromide or bromo-epoxy resin. Especially, it is necessary to actively develop flame retardant epoxy resin materials which will not endanger humans and are environmentally friendly to respond to the massive use of electrical and electric products and components containing FR-4 epoxy glass fiber laminated plates.

Thus, in order to protect human health and decrease environmental pollution, a reactive type of flame retardant material has been developed. The technique using phosphorus-containing compounds instead of bromine-containing compounds (flame retardant materials conventionally used) is widely accepted. The study and application of phosphorus system compounds for use as flame retardant materials that are environmentally friendly are currently extensive; for example, red phosphorus or phosphorus-containing organic compounds (such as triphenyl phosphate, triphenylmethyl phosphate, etc.) are directly added to substitute halide as a flame retardant to improve the burning property of polymer materials or hard resin materials. However, it is necessary to add such compounds in large amounts directly into resins to achieve flame retarding. The high migration due to the smaller molecular weight of the compound will affect the properties of resin substrates making, for example, electrical property, adhesive strength, etc., inferior, resulting in difficulty of application.

It is known that the technique employs a reactive type of phosphorus-containing epoxy resin instead of the bromine-containing or bromo-epoxy resins generally used as flame retardant ingredients, for example in U.S. Pat. No. 5,376,453, which utilizes the composition of phosphates having epoxy group and nitrogen-containing hardener to make laminated plates. It is necessary to add many kinds of phosphate-containing epoxy resin compositions to increase a phosphorus content that will achieve the high standard of UL 94V-0. In U.S. Pat. No. 5,458,978, a composition formed from epoxy phosphates, nitrogen-containing epoxy resin, and metal complex hardener is used to make laminated plates which has the flame retardant property approaching to UL 94V-0 (40 seconds, 50 seconds related to critical value). In U.S. Pat. Nos. 4,973,631 and 5,086,156, a trialkyl oxide having an active hydrogen substituent (such as amino group) is used alone or in combination with other amine hardeners to harden epoxy resins. In these hardening methods of introducing phosphorus to resins, the low content of phosphorus is not able to achieve the flame retardant effect. There is no actual measurement of the flame retardant effect in these two patents.

In the techniques disclosed above it is usually necessary to add many types of phosphorus-containing compounds to meet the flame retardant standard; however, additional additives usually make the processing conditions of products hard to control or the property of their products inferior.

Therefore, the method currently used to increase flame retardant property is to add nitrogen and phosphorus-containing substances instead of the currently used bromine- or antimony-containing substances. The nitrogen-containing substance frequently used is melamine, DICY, or cyanate which contains a triazine ring. The phosphorus-containing compound frequently used is a non-reactive phosphorus-containing compound or a phosphorus-containing compound which has a reactive functional group. Because the heat resistance of the non-reactive phosphorus-containing compound is inferior to the reactive phosphorus-containing compounds and is also more stable for reactive phosphorus-containing compounds binding to other molecules, the current flame retardant materials used are mainly those using a reactive phosphorus-containing compound. The reactive phosphorus-containing compound frequently used is linear. The heat resistance of reactive phosphorus-containing compound is inferior to that of the halogen-containing or non-halogen-containing epoxy resin composition, due to the —O—P—O— bonds on the backbone chain.

The present invention discloses an epoxy resin modified with a side chain having a reactive phosphorus-containing compound, wherein the reactive site which can react with epoxy group in the epoxy resin in the structure is the phosphorus compound on the side chain. The epoxy resin has better heat resistance than that of normal phosphorus-containing compound or epoxy resin, is suitable for flame retardant composition, and can replace the materials containing halogen compounds without affecting the processing property while it achieves environmental protection.

SUMMARY OF THE INVENTION

The present invention discloses an epoxy resin modified with a side chain having a reactive phosphorus-containing compound and the composition thereof. It is disclosed in the present invention that 9,10-dihydro-9-oxa-10-phosphaphenanthrene-10-oxide (hereinafter, referred to as HCA) having monofunctional reactivity is subjected to an addition reaction with reactive aldehyde to form a phosphorus-containing compound having an alcohol group, and then subjected to a condensation reaction with a compound having functional group such as phenols, organic acids, and the like; thus a reactive phosphorus-containing compound on the side chain is obtained. Such a phosphorus-containing compound can be used directly in the flame retardant resin composition, and also can be applied to thermoplastic plastics or thermosetting resin compositions.

Generally, the epoxy resin with low bromine content used in copper clad laminate, build up, and Resin Coated Copper (RCC) is obtained by reacting bisphenol type epoxy resin with tetrabromobisphenol. The bifunctional or polyfunctional phosphorus-containing compound disclosed in the present invention can be added directly to the resin composition as a substitute for tetrabromobisphenol or other bromine-containing compounds and phosphorus-containing compounds, or can be subject to addition reaction with epoxy resin to obtain phosphorus-containing compound epoxy resin.

The phosphorus-containing flame retardant resin composition usually used in the process is a linear phosphorus-containing compound or non-reactive phosphorus-containing compound resin compositions, which are much different in their processing properties. The phosphorus-containing compound modified epoxy resin disclosed in the present invention has a flame retardant phosphorus-containing substance. Since the phosphorus-containing compound side chain has a moiety which can react with the epoxy group in epoxy resin, the difference in processing properties will be small. As well, because side chain HCA molecular moiety may decrease the flowability, the molecules are more stable at high temperature and have higher heat resistance.

The epoxy resin having a phosphorus-containing compound on the side chain disclosed in the present invention can replace the hardened resins containing bromide which are currently used in, for example, epoxy molding compounds for IC packaging materials and composite materials.

The phosphorus-containing compound epoxy resin in the present invention can be added directly into thermoplastic resins, as in for example, polyol esters, polyethers, polyolefines, PEEK, PPE, POM, etc., or added directly to the compositions formed from said resin, or react with said resin to obtain phosphorus-containing compound resin compositions.

The phosphorus-containing compound epoxy resin and the composition thereof in the present invention have excellent heat resistance and flame retardant properties, can improve on the disadvantages of the known technology, and increase electrical and mechanical property as well as decrease the cost of manufacture. The novel phosphorus-containing compound modified epoxy resin compositions can be applied in the manufacture of prepregs, laminated plates, printed circuit boards, etc. which need to possess flame retardant property, and they can be used in combination with other said compositions to allow the laminated plates to have a high glass transition temperature and excellent heat resistance.

DETAILED DESCRIPTION OF THE INVENTION

The present invention relates to a flame retardant resin, which is an epoxy resin with a side chain having reactive phosphorus-containing compounds and can replace halide-containing resin or bromo-resin as a flame retardant component without affecting the processing properties.

Also, the present invention relates to a flame retardant resin composition, which includes:
(1) an epoxy resin with a side chain containing a reactive phosphorus-containing compound,
(2) a halogen-free hardener having a reactive hydrogen capable of reacting with the epoxy group in the epoxy resin, and
(3) a hardening promoter.

The above flame retardant resin composition has the improved property of excellent heat resistance and flame retarding. Said composition does not contain halogen, has excellent heat resistance and flame retardency and does not need any additional flame retardant substance. Also, the halogen-free hardener described above may be phosphorus- or nitrogen-containing compounds.

The epoxy resin modified with a side chain having a reactive phosphorus-containing compound and the composition including said resin are disclosed in the present invention, wherein the phosphorus-containing compound is formed by subjecting HCA to an addition reaction with reactive aldehyde to form an organic cyclic phosphorus compound, then subjecting it to a condensation reaction with compounds having a functional group, such as phenols, organic acids, and the like; thus a side chain having a reactive organic cyclic phosphorus compound thereon is obtained. For example, when HCA is subjected to an addition reaction with hydroxylbenaldehyde, then to a condensation reaction with phenols to give polyfunctional phosphorus-containing compounds, and when HCA is reacted with glyoxal, then reacted react with phenols in a condensation reaction, it yields polyfunctional phosphorus-containing compounds. The structure of the polyfunctional phosphorus-containing compounds is similar to bisphenols, but HCA substitutes one hydrogen atom or organic matter in the center of the structure. The polyfunctional organic cyclic phosphorus compounds can react with epoxy resins to produce phosphorus-containing compound modified epoxy resins (hereinafter sometimes referred to as flame retardant phosphorus-containing epoxy resins).

The phosphorus-containing compound modified epoxy resin disclosed in the present invention is represented by the formula (A)

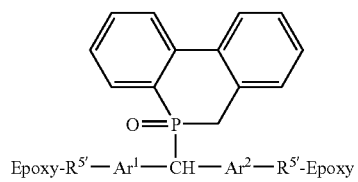

(A)

Epoxy-$R^{5'}$—$Ar^1$—CH—$Ar^2$—$R^{5'}$-Epoxy wherein $R^{5'}$ is a group selected from —O—, —NH—, —S—, —COO—, —SO$_3$—, —CO—, and —CH$_3$CON<; $Ar^1$ and $Ar^2$ are independently selected from the groups as follow:

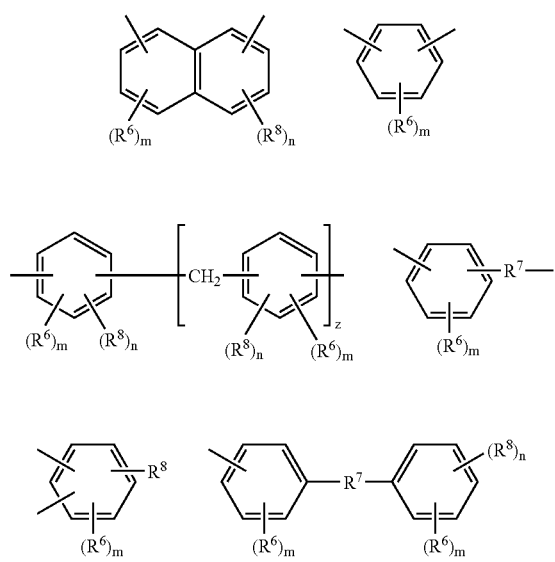

$R^6$ is H, $C_{1-10}$ alkyl or aryl; $R^7$ is —CH$_2$—, —(CH$_3$)$_2$C—, —SO$_2$—, —CO—, —O—; $R^8$ is —OH, —NH$_2$, —SH, —COOH, —SO$_3$H, —COH, or —NHCOCH$_3$; m and n are integers from 0 to 4; z is an integer from 1 to 20; Epoxy- is a group containing at least one epoxy ring.

$C_{1-10}$ alkyl represented by $R^6$ in the above formula is referred to as a linear or branched alkyl group having 1 to 10 carbon atoms, including methyl, ethyl, isopropyl, n-propyl, n-butyl, sec-butyl, tert-butyl, n-pentyl, isopentyl, n-hexyl, heptyl, octyl, nonyl, decyl, etc.

Aryl represented by $R^6$ in the above formula is referred to as an aromatic group having 6 to 10 carbon atoms, including phenyl, naphthyl, etc.

The phosphorus-containing compound modified epoxy resin is prepared by reacting a phosphorus-containing compound of formula (B),

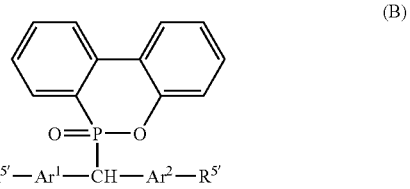

(B)

$R^{5'}$—$Ar^1$—CH—$Ar^2$—$R^{5'}$ wherein $R^5$ is a group selected from —OH, —NH$_2$, —SH, —COOH, —SO$_3$H, —COH, and —NHCOCH$_3$ while $Ar^1$ and $Ar^2$ are independently selected from the following groups:

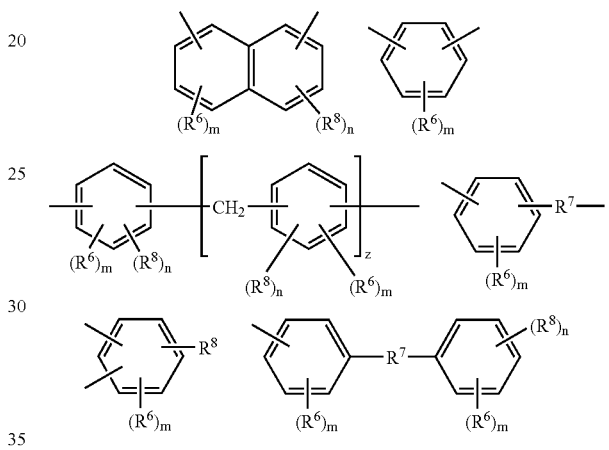

$R^6$ is H, $C_{1-10}$ alkyl or aryl; $R^7$ is —CH$_2$—, —(CH$_3$)$_2$C—, —SO$_2$—, —CO—, —O—; $R^8$ is —OH, —NH$_2$, —SH, —COOH, —SO$_3$H, —COH, or —NHCOCH$_3$; m and n are integers from 0 to 4; z is an integer from 1 to 20, with either an epoxy resin containing at least two epoxy groups or with an epihalohydrin.

The phosphorus-containing compound (B) described above is obtained by addition reacting HCA as represented by formula (C),

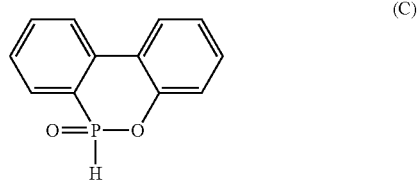

(C)

with a compound containing a C═O reactive group (for example, aldehydes, etc.) to form a phosphorus-containing compound having an alcohol group, then condensation reacting it with a compound such as phenols, organic acids, or the like to give the phosphorus-containing compound represented as formula (B).

The embodiments of the epoxy resin containing at least two epoxy groups include bisphenol glycidyl ether, biphenyl glycidyl ethers, dihydroxybenzene glycidyl ethers, glycidyl ethers containing nitrogen hetero ring dihydroxynaphthalene glycidyl ethers, phenolics polyglycidyl ethers, polyhydroxyglycidyl ethers, etc.

The embodiments of the epihalohydrin include epichlorohydrin and epibromohydrin.

The embodiments of bisphenol glycidyl ethers include bisphenol A glycidyl ethers, bisphenol F glycidyl ethers, bisphenol AD glycidyl ethers, bisphenol S glycidyl ethers, tetramethyl bisphenol A glycidyl ethers, tetramethyl bisphenol F glycidyl ethers, tetramethyl bisphenol AD glycidyl ethers, tetramethyl bisphenol S glycidyl ethers, etc.

The embodiments of biphenyl glycidyl ethers include 4,4'-biphenyl glycidyl ether, 3,3'-dimethyl-4,4'-biphenyl glycidyl ether, 3,3',5,5'-tetramethyl-4,4'-biphenyl glycidyl ether, etc.

The embodiments of dihydroxybenzene glycidyl ethers include resorcinol glycidyl ether, quinol glycidyl ether, isobutyldihydroxybenzene glycidyl ether, etc.

The embodiments of phenolic polyglycidyl ethers include phenolic polyglycidyl ether, cresol phenolic polyglycidyl ether, bisphenol A phenolic polyglycidyl ether, etc.

The embodiments of phenyl polyhydroxyphenol polyglycidyl ether include tris(4-hydroxyphenyl)methane polyglycidyl ether, tris(4-hydroxyphenyl)ethane polyglycidyl ether, tris(4-hydroxyphenyl)propane polyglycidyl ether, tris(4-hydroxyphenyl)butane polyglycidyl ether, tris(3-methyl-4-hydroxyphenyl)methane polyglycidyl ether, tris(3,5-dimethyl-4-hydroxyphenyl)methane polyglycidyl ether, tetrakis(4-hydroxyphenyl)ethane polyglycidyl ether, tetrakis(3,5-dimethyl-4-hydroxyphenyl)ethane polyglycidyl ether, bicyclopentene-phenolic polyglycidyl ether, etc.

The embodiments of glycidyl ethers containing a nitrogen hetero ring include triglycidyl ether of isocyanurate, triglycidyl ether of cyanurate, etc.

The embodiments of dihydroxynaphthalene glycidyl ethers include 1,6-dihydroxynaphthalene diglycidyl ethers, 2,6-dihydroxynaphthalene diglycidyl ethers, etc.

The epoxy resins described above can be used alone or in combination as the mixture of two or more. Among them, bisphenol A glycidyl ether, phenolic polyglycidyl ether, tris(4-hydroxyphenyl)methane polyglycidyl ether, bicyclopentene-phenolic polyglycidyl ether, tetrakis(4-hydroxyphenyl)ethane polyglycidyl ether, and the mixtures thereof are preferred.

The manufacture of the flame retardant resin of the present invention optionally includes other compounds containing active hydrogens, for example, amines, bisphenol resins, dihydroxybenzene, polyhydroxyphenol resins, phenolics, etc.

The embodiments of amines include dicyanodiamide, diaminodiphenylmethane, etc.

The embodiments of bisphenol resins include compounds represented by —Ph—X—Ph— (wherein Ph represents phenylene, X is —CH$_2$—, —C(CH$_3$)$_2$—, —O—, —S—, —CO—, or —SO$_2$—), for example, bisphenol A, bisphenol F, bisphenol AD, bisphenol S, tetramethyl bisphenol A, tetramethyl bisphenol F, tetramethyl bisphenol AD, tetramethyl bisphenol S, 4,4'-biphenyl, 3,3'-dimethyl-4,4'-biphenyl, 3,3',5,5'-tetramethyl-4,4'-biphenyl, etc.

The embodiments of dihydroxybenzene include resorcinol, quinol, isobutyldihydroxybenzene.

The embodiments of poly(hydroxyphenol) resin include tris(4-hydroxyphenyl)methane, tris(4-hydroxyphenyl)ethane, tris(4-hydroxyphenyl)propane, tris(4-hydroxyphenyl)butane, tris(3-methyl-4-hydroxyphenyl)methane, tris(3,5-dimethyl-4-hydroxyphenyl)methane, tetrakis(4-hydroxyphenyl)ethane, tetrakis(3,5-dimethyl-4-hydroxyphenyl)ethane, etc.

The embodiments of phenolics include phenol-formaldehyde condensate, cresol phenolic condensate, bisphenol A phenolic condensate, bicyclopentene-phenolic condensate.

Among these, bisphenol A, bisphenol F, bisphenol AD, bisphenol S, tetramethyl bisphenol A, and resorcinol biphenol are preferred.

In the production of the flame retardant epoxy resins of the present invention, the equivalent weight ratio of the above-mentioned components, epoxy resin (or epihalohydrin): HCA, is 100:5 to 100:150, preferably 100:10 to 100:50, more preferably 100:15 to 100:40. When the relative ratio of the phosphorus-containing compound is more than 150, the solubility of the resin solvent decreases and the viscosity of the resin solution increases. When the relative ratio of phosphorus-containing compounds is less than 5, the flame retardant property of the product is inferior.

The reaction for producing the flame retardant phosphorus-containing epoxy resin can be advancement reaction or reflux reaction, wherein the reflux reaction is the process of reaction in which the solvent refluxes. The suitable solvents are ketones, organic aromatics, non-proton solvents, ethers, and esters. Among organic aromatics, toluene and xylene are preferred. Among ketones, acetone, methyl ethyl ketone, and methyl isobutyl ketone are preferred. Among non-proton solvents, N,N-dimethylformamide, N,N-diethylformamide, and dimethyl sulfoxide are preferred. Among ethers, ethylene glycol monomethyl ether and propylene glycol monomethyl ether are preferred. Among esters, ethyl acetate, ethyl isopropionate, and propylene glycol monomethyl ether acetate are preferred.

The reaction of compound(B) and the epoxy resin having at least two epoxy group is generally conducted at a temperature of 50 to 350° C., preferably 50 to 300° C., more preferably 100 to 250° C., most preferably 100 to 200° C. under an normal pressure. When the reaction temperature is higher than 350° C., the by-products are easily formed and it is difficult to control the reaction speed; as well, deterioration of the resins may possibly be accelerated. When the reaction temperature is lower than 50° C., the reaction efficiency will be poor and it will be difficult for the resulting resins to meet the requirement for application at high temperature.

The reaction of compound (B) and the epihalohydrin is generally conducted at a temperature of 50 to 350° C., preferably 50 to 300° C., more preferably 100 to 250° C., most preferably 100 to 200° C. under a reduced pressure.

The present invention also relates to a flame-retardant resin composition comprising:

(1) the above-mentioned epoxy resin modified by a side chain containing a reactive phosphorus-containing compound of the present invention, (2) a halogen-free hardener having an active hydrogen capable of reacting with the epoxy group in the epoxy resin, and (3) a hardening promoter In addition to the epoxy resin with a side chain having a reactive phosphorus-containing compound of the present invention, the flame retardant resin composition also may contain other epoxy resins containing no phosphorus.

The epoxy resins containing no phosphorus may be any epoxy resin. The embodiments include bisphenol glycidyl ether, biphenyl glycidyl ethers, dihydroxybenzene glycidyl ethers, glycidyl ethers containing the nitrogen hetero ring, dihydroxynaphthalene glycidyl ethers, phenolics polyglycidyl ethers, polyhydroxyphenol polyglycidyl ethers, etc.

The embodiments of bisphenol glycidyl ethers include bisphenol A glycidyl ethers, bisphenol F glycidyl ethers, bisphenol AD glycidyl ethers, bisphenol S glycidyl ethers, tetramethyl bisphenol A glycidyl ethers, tetramethyl bisphenol F glycidyl ethers, tetramethyl bisphenol AD glycidyl ethers, tetramethyl bisphenol S glycidyl ethers, etc.

The embodiments of biphenyl glycidyl ethers include (4,4'-biphenyl) glycidyl ether, 3,3'-dimethyl-(4,4'-biphenyl) glycidyl ether, 3,3',5,5'-tetramethyl-(4,4'-biphenyl) glycidyl ether, etc.

The embodiments of dihydroxybenzene glycidyl ethers include 1,3-dihydroxybenzene glycidyl ether, 1,4-dihydroxybenzene glycidyl ether, 5-isobutyl-1,3-dihydroxybenzene glycidyl ether, etc.

The embodiments of phenolic polyglycidyl ethers include phenolic polyglycidyl ether, cresol phenolic polyglycidyl ether, bisphenol A phenolic polyglycidyl ether, etc.

The embodiments of phenyl polyhydroxyphenol polyglycidyl ether include tris(4-hydroxyphenyl)methane polyglycidyl ether, tris(4-hydroxyphenyl)ethane polyglycidyl ether, tris(4-hydroxyphenyl)propane polyglycidyl ether, tris(4-hydroxyphenyl)butane polyglycidyl ether, tris(3-methyl-4-hydroxyphenyl)methane polyglycidyl ether, tris(3,5-dimethyl-4-hydroxyphenyl)methane polyglycidyl ether, tetrakis(4-hydroxyphenyl)ethane polyglycidyl ether, tetrakis(3,5-dimethyl-4-hydroxyphenyl)ethane polyglycidyl ether, bicyclopentene-phenolic polyglycidyl ether, etc.

The embodiments of glycidyl ethers containing aza-heterocyclic ring include triglycidyl ether of isocyanurate, triglycidyl ether of cyanurate, etc.

The embodiments of dihydroxynaphthalene glycidyl ethers include 1,6-dihydroxynaphthalene diglycidyl ethers, 2,6-dihydroxynaphthalene diglycidyl ethers.

The epoxy resins can be used alone or in combination as the mixture of two or more epoxy resins.

The preferred embodiments are bisphenol A glycidyl ether, phenolic polyglycidyl ether, cresol phenolic polyglycidyl ether, tris(4-hydroxyphenyl)methane polyglycidyl ether, bicyclopentene-phenolic polyglycidyl ether, tetrakis(4-hydroxyphenyl)ethane polyglycidyl ether, and the mixtures thereof.

According to the present invention, the content ratio of the flame retardant phosphorus-containing epoxy resin to the non-phosphorus-containing epoxy resin mentioned above is such that the flame retardant phosphorus-containing epoxy resin is from 5 to 100 wt %, preferably from 20 to 100 wt %, and more preferably from 25 to 100 wt % of the total epoxy resin composition. If the ratio of content is less than 5 wt %, the flame retardant property and heat resistance will not be sufficient.

The hardeners in the flame retardant and heat resistant epoxy resin compositions of the present invention comprise the phosphorus- or nitrogen-containing hardeners which contain a compound with an active hydrogen which can react with an epoxy group and other halogen-free hardeners.

The useful nitrogen- and phosphorus-containing resin hardeners in the flame retardant resin composition of the present invention have the structure represented by formula (D),

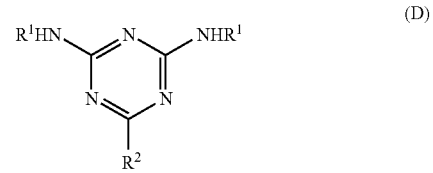

wherein $R^1$ is selected from hydrogen atom or any structure of formulas $(E_1)$ or $(E_2)$, but where at least one $R^1$ is not a hydrogen atom:

$(E_1)$ $R^1$=—$[CH_2$—$R^3]_n$H, wherein $R^3$ is phenylene, naphthylene, or the group of the following formula,

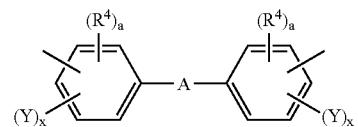

wherein A is —O—, —S—, —$SO_2$—, —CO—, —$CH_2$—, —$C(CH_3)_2$—, or the group of the formula:

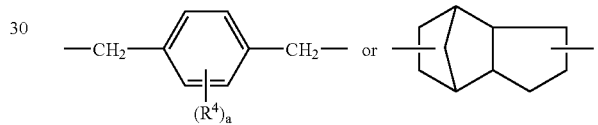

$R^4$ is H, $C_{1-10}$ is an alkyl or aryl; Y is —OH, —$NH_2$, —COOH; a is an integer of 0 to 2; x is an integer of 0 to 4; among the groups represented by $R^3$ and A described above, the aryl may be substituted by one or more substituents selected from a hydroxy, amino, carboxy, or a $C_{1-6}$ aliphatic group.

$(E_2)$

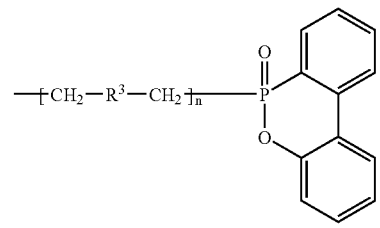

$R^2$ is —$NHR^1$, $C_{1-6}$ alkyl or aryl; n is an integer of 0–20; but at least one $R^1$ is not a hydrogen atom. The definitions of $R^3$ and n in formula $(E_2)$ are respectively the same as those in the above formula $(E_1)$.

The other halogen-free hardeners which can react with epoxy groups in the flame retardant resin composition of the present invention include amines, bisphenol resins, dihydroxybenzene, polyhydroxyphenol resins, and phenolics.

The embodiments of amines comprise dicyanodiamide, diaminodiphenylmethane, etc.

The embodiments of bisphenol resins comprise compounds represented by —Ph—X—Ph— (wherein Ph represents phenylene, X is —CH$_2$—, —C(CH$_3$)$_2$—, —O—, —S—, —CO—, or —SO$_2$—), for example, bisphenol A, bisphenol F, bisphenol AD, bisphenol S, tetramethyl bisphenol A, tetramethyl bisphenol F, tetramethyl bisphenol AD, tetramethyl bisphenol S, (4,4'-biphenyl), 3,3'-dimethyl-4,4'-biphenyl, 3,3',5,5'-tetramethyl-(4,4'-biphenyl), etc.

The embodiments of dihydroxybenzene include resorcinol, quinol, isobutylquinol.

The embodiments of poly(hydroxyphenol) resin include tris(4-hydroxyphenyl)methane, tris(4-hydroxyphenyl)ethane, tris(4-hydroxyphenyl)propane, tris(4-hydroxyphenyl)butane, tris(3-methyl-4-hydroxyphenyl)methane, tris(3,5-dimethyl-4-hydroxyphenyl)methane, tetrakis(4-hydroxyphenyl)ethane, tetrakis(3,5-dimethyl-4-hydroxyphenyl)ethane, etc.

The embodiments of phenolics include phenol-formaldehyde condensate, cresol phenolic condensate, bisphenol A phenolic condensate, bicyclopentene-phenolic condensate.

The hardener content in the flame retardant resin compositions of the present invention depends on the equivalent weight of the reactive hydrogen in the hardeners and the epoxy equivalent weight in the epoxy resins. In the epoxy equivalent weight in the epoxy resins, the equivalent weight of the reactive hydrogen in the hardeners is 20 to 140%, preferably 40 to 95%, more preferably 50 to 95%.

The embodiments of the hardening promoters contained in the flame retardant resin composition comprise tertiary amines, tertiary phosphines, quaternary ammonium salts, quaternary phosphonium salts, boron trifluoride complex, lithium compounds, imidazole compounds, and the mixture thereof.

The embodiments of the tertiary amines comprise triethylamine, tributylamine, dimethylethanolamine, dimethylphenylamine, tris(N,N-dimethylaminomethyl)phenol, N,N-dimethylaminomethylphenol, etc.

The embodiments of the tertiary phosphines comprise triphenylphosphine.

The embodiments of the quaternary ammonium salts comprise tetramethylammonium chloride, tetramethylammonium bromide, tetramethylammonium iodide, triethylbenzylammonium chloride, triethylbenzylammonium bromide, triethylbenzylammonium iodide, etc.

The embodiments of the quaternary phosphonium salts comprise tetrabutylphosphonium chloride, tetrabutylphosphonium bromide, tetrabutylphosphonium iodide, tetrabutylphosphonium acetate complex, tetraphenylphosphonium chloride, tetraphenylphosphonium bromide, tetraphenylphosphonium iodide, ethyltriphenylphosphonium chloride, ethyltriphenylphosphonium bromide, ethyltriphenylphosphonium iodide, ethyltriphenylphosphonium acetate complex, ethyltriphenylphosphonium phosphate complex, propyltriphenylphosphonium chloride, propyltriphenylphosphonium bromide, propyltriphenylphosphonium iodide, butyltriphenylphosphonium chloride, butyltriphenylphosphonium bromide, butyltriphenylphosphonium iodide, etc.

The imidazole compounds comprise, for example, 2-methylimidazole (2MI), 2-phenylimidazole (2PI), 2-ethyl-4-methylimidazole (2E4MZ), C$_{11}$MI, C$_{17}$MI, etc. Said hardening promoters can be used alone or in combination with two or more mixtures.

The preferred hardening promoters are tertiary amines, tertiary phosphines, and imidazole compounds, especially dimethylaniline, 2-methylimidazole (2MI), 2-phenylimidazole (2PI), 2-ethyl-4-methylimidazole (2E4MZ).

The amount of the hardening promoters used is from 50 to 50000 ppm, preferably from 100 to 30000 ppm, more preferably from 200 to 10000 ppm, and most preferably from 500 to 2000 ppm of the total weight of the composition. If the added amount of the hardening promoters is more than 50000 ppm, the reaction time will decrease but the application properties will be affected due to the formation of by-products. For example, in the application for circuit board laminated plates, the electrical property, resistance to wetting, water absorption, etc. will deteriorate. If the added amount is less than 50 ppm, the reaction time will be slow and inefficient.

The flame retardant resin compositions of the present invention have excellent heat resistance and flame retardant properties, and, after hardened by hardeners, are suitable for high heat resistant materials, for example, adhesive plates or prepregs, composite materials, laminated plates, printed circuit boards, copper foil adhesives for resin coated copper foil (RCC), epoxy resin modeling compounds in IC package materials (EMC's), high heat resistant powder coatings, engineering plastics, etc. The components in the composition will depend on the usage.

Additionally, in the epoxy resin composition modified with the phosphorus-containing compound of the present invention, the viscosity can be adjusted by the addition of a solvent to formulate the composition into varnish. The suitable solvents include organic benzenes, ketones, non-proton solvents, ethers, and esters. Organic benzenes include, for example, toluene and xylene. Ketones acetone, methyl ethyl ketone, and methyl isobutyl ketone. Aprotic solvents include, for example, N,N-dimethylformamide, N,N-diethylformamide, and dimethyl sulfoxide. Ethers include, for example, ethylene glycol monomethyl ether and propylene glycol monomethyl ether. Esters include, for example, ethyl acetate, ethyl isopropionate, and propylene glycol monomethyl ether acetate. The viscosity is mainly controlled in the range of 20 to 500 cps/25° C. during the formation.

Generally, the addition of the hardening promoters and the selective addition of solvents are preferred to allow the gelling time of said flame retardant resin varnish to be controlled in the range of 30 to 500 sec/171° C. where the viscosity is controlled in the range of 20 to 500 cps/25° C.

According to the application, general additives and modifiers, such as, for example, heat stabilizers, light stabilizers, UV absorbents, plasticizers, etc., can also be added to the compositions of the present invention.

The phosphorus-containing compound modified epoxy resin compositions having heat resistance and flame retarding property of the present invention are useful for manufacturing laminated plates or adhesive plates, which may use impregnated organic or inorganic fiber substrates, for example, glass, metal, carbon fiber, aramid, borides, cellulose.

The flame retardant resin compositions of the present invention can be manufactured by conventional methods into laminated entities of copper foil, fiber supports, and the flame retardant resin compositions of the present invention.

The phosphorus-containing epoxy resin flame retardant compositions of the present invention can be formulated with the nitrogen-containing epoxy resin into varnish, with which glass fiber fabric or organic fiber is impregnated, then dried by heating, giving a dry prepreg. The prepreg can further be shaped into composite material laminated plates or used alone in the adhesive layer of other laminated plates. Alternatively copper foil maybe placed on one side or both sides of a prepreg or the combination of more prepregs, and the prepreg or the combination may be heated under pressure. The laminated plate composite material thus obtained is superior to the standards of the current products in respect to size stability, resistance to chemicals, resistance to corrosion, moisture absorption, and electrical properties, and is suitable for producing electrical products for electronic, space, and transport, and for manufacturing printed circuit boards and multi-layer circuit boards. The useful impregnated fiber substrates are organic or inorganic fiber substrates, comprising, for example, glass fiber, metal fiber, carbon fiber, aramid fiber, boron, cellulose, etc.

Alternatively, the flame retardant and heat resistant resin compositions of the present invention can be formulated into varnish, where the varnish is coated on copper foil, then dried by heating, yielding dry film-coated copper foil. The film-coated copper foil can be stored at room temperature for months and has good stability in storage. The film-coated copper foil can be further shaped into composite material laminated plates or used alone in the adhesive layer of other plastic plates, or it can be used in combination with one or more film-coated copper foils which are built-up one-by-one on the up side or on both the up and down sides. The laminated plate composite material thus obtained is superior to the standards of the current products in respect to size stability, resistance to chemicals, resistance to corrosion, moisture absorption, and electrical properties, and is suitable for producing multi-layer printed circuit boards for electronics, space, and transport.

Also, the present invention relates to a method which uses the flame retardant resin composition to produce hardened entities, wherein the composition is hardened at a reaction temperature of from 20 to 350° C., preferably from 50 to 300° C., more preferably from 100 to 250° C., most preferably from 120 to 220° C. Th above-mentioned reaction temperature for hardening must be controlled carefully. If the temperature is too high, there will easily be a side reaction where it will be difficult to control the reaction speed, thus increasing the deterioration speed of the resin. If the temperature is too low, in addition to the poor efficiency, it will be difficult for the properties of the resulting resin to meet the requirements for usage under high temperature.

According to the flame retardant and heat resistant resin composition of the present invention, the flame retardant property and the heat resistance of epoxy resins will be maintained without adding other processing auxiliary agents and flame retardant additives.

The present invention will be further described with reference to the following Examples, but the scope of the present invention is by no means limited.

The components used in the Synthesis Examples and the Examples are described in detail as follow:

Epoxy resin 1: an epoxy resin produced by Chang Chun Plastics Co., Ltd. Taiwan under trade name CNE200ELB, which is a polyglycidyl ether of a cresol-phenolic condensate. The epoxy equivalent weight is between 200 and 220 g/eq, and the hydrolytic chlorine is under 200 ppm.

Epoxy resin 2: an epoxy resin produced by Chang Chun Plastics Co., Ltd. Taiwan under trade name PNE177, which is a phenolic polyglycidyl ether. The epoxy equivalent weight is between 170 and 190 g/eq, and the hydrolytic chlorine is under 1000 ppm.

Epoxy resin 3: an epoxy resin produced by Chang Chun Plastics Co., Ltd. Taiwan under trade name BE188EL, which is a bisphenol A diglycidyl ether. The epoxy equivalent weight is between 180 and 195 g/eq, and the hydrolytic chlorine is under 200 ppm.

Epoxy resin 4: an epoxy resin produced by Chang Chun Plastics Co., Ltd. Taiwan under trade name BEB530A80, which is a diglycidyl ether of tetrabromobisphenol A. The epoxy equivalent weight is between 430 and 450 g/eq, while the bromine content is between 18.5 and 20.5 wt %.

HCA: 9,10-dihydro-9-oxa-10-phosphaphenanthrene-10-oxide.

Catalyst A (also referred to as a hardening promoter): triphenyl phosphine, 10% dissolved in methyl ethyl ketone.

Catalyst B: 2-methylimidazole (2MI), 10% dissolved in methyl ethyl ketone.

Hardener A: dicyanodiamide, 10% dissolved in dimethyl formamide.

Hardener B: produced by Hitachi Chemical Co., Japan under trade name melan 9000 $^{TM70}$.

Hardener C: produced by Chang Chun Plastics Co., Ltd. Taiwan under trade name BEH510. The active hydrogen equivalent weight is between 105 and 110 g/eq.

Epoxy equivalent weight (EEW), viscosity of varnish, solid content used herein are measured according to the methods as follow:

(1) Epoxy equivalent weight: the epoxy resin is dissolved in the solvent of chlorobenzene:chloroform (1:1) and titrated with HBr/glacial acetic acid according to the method in ASTM D1652 to measure epoxy equivalent weight, wherein the indicator is crystal violet.

(2) Viscosity: the phosphorus-containing epoxy resin varnish is placed in a thermostat at 25° C. for 4 hours, while its viscosity is measured at 25° C. with a Brookfield viscosimeter.

(3) Solid content: 1 gram of the varnish sample containing the phosphorus-containing epoxy resin of the present invention is placed in an oven at 150° C. for 60 minutes after which and the weight percentage of the resulting non-volatile components is measured.

SYNTHESIS EXAMPLE 1

Synthesis of Phosphorus-Containing Compound HCP 216 g of organic cyclic phosphorus compound HCA (9,10-dihydro-9-oxa-10-phosphaphenanthrene-10-oxide) was placed in a glass reaction kettle and stirred to melt. When the temperature reached 110° C., 32.6 g of polyformaldehyde (produced by Chang Chun Plastics Co., Ltd. Taiwan, Paraformaldehyde 92%) was added, the temperature was elevated to 150° C., and the reaction was continued for more than 3 hours. After the pressure was decreased to 20 mmHg and kept for 1 hour, yielding 246 g of organic cyclic phosphorus compound HCAL, 246 g of toluene was added. The toluene was heated and stirred to dissolve in the glass reaction kettle. When the temperature reached 110° C., 94 g of phenol and 2.5 g of p-toluenesulfonic acid were added, and the reaction was continued for 3 hours. Then the reaction was cooled down to the room temperature, the reaction mixture was filtered and dried to give an organic cyclic phosphorus compound referred to as HCP.

The organic cyclic phosphorus compound HCP formed in the above-mentioned reaction has a melting point of 146° C. The result of the elementary analysis is as follow:

| | C% | H% | P% |
|---|---|---|---|
| Found: | 74.3% | 4.9% | 10.2% |
| Calculated: ($C_{19}H_{15}O_2P$ formula weight = 306) | 74.51% | 4.9% | 10.13% |

SYNTHESIS EXAMPLE 2

Synthesis of Phosphorus-Containing Compound HDP

Organic cyclic phosphorus compound HCA (216 g) placed in a glass reaction kettle was heated and stirred to melt. When the temperature reached 110° C., 72.5 g of 40% glyoxal was added, and the reaction was continued for more than 3 hours. Then the reaction was cooled down to the room temperature, the reaction mixture was filtered and dried to give an organic cyclic phosphorus compound referred to as HCAG.

The organic cyclic phosphorus compound HCAG formed in the above-mentioned reaction has a melting point of 243° C. The result of the elementary analysis is as follow:

|  | C% | H% | P% |
|---|---|---|---|
| Found: | 63.9% | 4.1% | 12.5% |
| Calculated: | 63.67% | 4.08% | 12.65% |
| ($C_{26}H_{20}O_6P_2$ formula weight = 490) | | | |

245 g of organic cyclic phosphorus compound HCAG and 245 g of toluene were placed in the glass reaction kettle, heated, and stirred to dissolve. When the temperature reached 110° C., 94 g of phenol and 2.5 g of p-toluenesulfonic acid were added, and the reaction was continued for more than 3 hours. After the reaction was cooled down to room temperature, the reaction mixture was filtered and dried to give an organic cyclic phosphorus compound referred to as HDP.

The organic cyclic phosphorus compound HDP formed in the above-mentioned reaction has a melting point of 260° C. The result of the elementary analysis is as follow:

|  | C% | H% | P% |
|---|---|---|---|
| Found: | 71.2% | 4.4% | 9.6% |
| Calculated: | 71.03% | 4.36% | 9.66% |
| ($C_{38}H_{28}O_6P_2$ formula weight = 642) | | | |

SYNTHESIS EXAMPLE 3

Synthesis of Organic Cyclic Phosphorus-Containing Compound HPP

Organic cyclic phosphorus compound HCA (216 g) placed in a glass reaction kettle was heated and stirred to melt. When the temperature reached 110° C., 112 g of 4-hydroxybenzaldehyde was added, and the reaction then continued for more than 3 hours. After the reaction was cooled down to the room temperature, the reaction mixture was filtered and dried to give an organic cyclic phosphorus compound referred to as HCAB. M.p.=212° C.

The organic cyclic phosphorus compound HCAB (338 g) and toluene (338 g) were placed into a glass reaction kettle and heated under stirring. When the temperature reached 110° C., 94 g of phenol and 3.4 g of p-toluenesulfonic acid were added, and the reaction was continued for further more than 3 hours. The reaction mixture was cooled down to room temperature, filtered and dried to give an organic compound referred to as HPP.

The organic cyclic phosphorus compound HPP formed in the above-mentioned reaction has a melting point of 286° C. The result of the elementary analysis is as follow:

|  | C% | H% | P% |
|---|---|---|---|
| Found: | 72.7% | 4.6% | 7.4% |
| Calculated: | 72.46% | 4.59% | 7.49% |
| ($C_{25}H_{19}O_4P$ formula weight = 414) | | | |

SYNTHESIS EXAMPLE 4

Synthesis of Phosphorus-Containing Epoxy Resin A

Epoxy resins (100 g) and organic cyclic phosphorus compound HPP (380.5 g) were placed in a 3000 ml of five-neck glass reaction kettle equipped with an electric heating jacket, a temperature controller, an electric stirrer and a stirring bar, a nitrogen gas inlet, a thermocouple, a water-cooled condenser, and a feeding funnel. Nitrogen gas was introduced and the reaction kettle was heated to 120° C. After epoxy resin 3 and HCA completely melted, the raw materials were dried under vacuum. The steps of introducing nitrogen gas and drying were carried out two more times. When the temperature of the reaction kettle was decreased from 85 to 90° C., catalyst A (6.0 g) was added. The stirrer was started to mix the resin and catalyst and the nitrogen gas was introduced. The resulting mixture was heated to 160° C. and kept for 10 minutes. It was found that the reactants were slowly exothermic. After the exothermic reaction continued and the temperature rose to 180° C., this temperature was kept for 3 hours and phosphorus-containing epoxy resin A was obtained. The epoxy equivalent weight was 396, and the theoretical phosphorus content was 2.0 wt %.

SYNTHESIS EXAMPLES 5 TO 7

The reaction of this synthesis example was similar to synthesis example 1, but after the reaction, the solvents shown in table 1 were added to the resulting epoxy resin, yielding phosphorus-containing resin in solution form. The epoxy equivalent weights, solid contents, and theoretical phosphorus contents of the resulting phosphorus-containing resin in Synthesis Examples 2 to 4 are shown in table 2.

TABLE 1

Formulations of Synthesis Examples 4 to 7

|  | Synthesis Example Phosphorus-Containing Epoxy Resin A | Synthesis Example Phosphorus-Containing Epoxy Resin B | Synthesis Example Phosphorus-Containing Epoxy Resin C | Synthesis Example Phosphorus-Containing Epoxy Resin D |
|---|---|---|---|---|
| Epoxy Resin 1 (g) |  |  |  | 362 |
| Epoxy Resin 2 (g) |  | 360 |  |  |
| Epoxy Resin 3 (g) | 1000 | 640 | 1000 | 625 |
| HPP (g) | 380.5 | 380.5 | 454 | 380.5 |
| Bisphenol A (g) |  |  |  | 13 |

TABLE 1-continued

Formulations of Synthesis Examples 4 to 7

| | Synthesis Example Phosphorus-Containing Epoxy Resin A | Synthesis Example Phosphorus-Containing Epoxy Resin B | Synthesis Example Phosphorus-Containing Epoxy Resin C | Synthesis Example Phosphorus-Containing Epoxy Resin D |
|---|---|---|---|---|
| Catalyst A (g) | 6.0 | 6.0 | 6.0 | 5.9 |
| Propylene glycol Monomethyl ether acetate (ml) | 230 | 230 | 242.3 | 230 |
| Acetone (ml) | 230 | 230 | 242.3 | 230 |

TABLE 2

Property Test of Phosphorus-Containing Epoxy Resins

| | Phosphorus-Containing Epoxy Resin A | Phosphorus-Containing Epoxy Resin B | Phosphorus-Containing Epoxy Resin C | Phosphorus-Containing Epoxy Resin D |
|---|---|---|---|---|
| Epoxy Equivalent Weight (g/eg) | 396 | 389 | 472 | 438 |
| Solid Content | 74.9% | 74.7% | 75.1% | 75.0% |

SYNTHESIS EXAMPLE 8

Synthesis of Phosphorus- and Nitrogen-Containing Hardener D 1410 g of phenol (15 moles), 244.7 g of 92% paraformaldehyde (7.5 moles), 337 g of benzoguanamine (1.8 moles), 259 g of HCA (1.2 moles), and 11.2 g of oxalic acid in a 3000 ml of five-neck glass reaction kettle equipped with an electric heating jacket, a temperature controller, an electric stirrer and a stirring rod, a nitrogen gas inlet, a thermocouple, a water-cooled condenser, and a feeding funnel. After melting, the raw materials were dried under vacuum. The steps of introducing nitrogen gas and drying the row materials under a vacuum were carried out two more times after the temperature of the reaction kettle was elevated from 100 to 110° C., and kept for 3 hours, then the temperature of the reaction kettle was elevated from 120 to 125° C., and kept for 2 more hours. After the reaction, the unreacted phenol and reacted condensed water were slowly distilled off under normal pressure. Finally, the mixture was kept at 180° C. under a vacuum for 1 hour. The resulting product was phosphorus- and nitrogen-containing hardener D. After analysis, the softening point was 161° C. While theoretical nitrogen content was 10.0 wt %, and the phosphorus content was 2.93 weight %, the active hydrogen equivalent weight is 210 g/eq.

SYNTHESIS EXAMPLE 9

Synthesis of Phosphorus-Containing Epoxy Resin

The organic cyclic phosphorus-containing compound HPP (414 g, produced in Synthesis Example 3) and epichlorohydrin (925 g) were placed into a glass reactor kettle, stirred and heated to a temperature of 55° C. 49.5 wt % aqueous solution of sodium hydroxide (153.5 g) was added to the mixture and reacted at that temperature for 5 hours under a reduced pressure. The resultant reaction mixture was heated under a vacuum to recover unreacted epichlorohydrin. After the temperature reached 155° C., the pressure was released. Water and methyl isobutyl ketone were added to the reaction mixture to effect the extraction. Aqueous phase was separated and the organic phase was evaporated to give 518 g of a phosphorus-containing epoxy resin of the present invention (referred to as BEP-270). The phosphorus-containing epoxy resin has an epoxy equivalent of 288 g/eq and a softening point of 85° C.

SYNTHESIS EXAMPLE 10

Synthesis of Phosphorus-Containing Epoxy Resin

Organic cyclic phosphorus compound HCA (216 g) placed in a glass reaction kettle was heated and molten under stirring. When the temperature reached 110° C., 112 g of 4-hydroxybenzaldehyde was added and the reaction was continued further for more than 3 hours. Then the reaction was cooled down to the temperature, the reaction mixture was filtered and dried to obtain an organic cyclic phosphorus compound referred to as HCAB. M.p.=212° C.

The organic cyclic phosphorus compound HCAB (338 g) and toluene (338 g) were placed into a glass reactor kettle and heated under stirring. When the temperature reached 110° C., 108 g of o-cresol and 3.4 g of p-toluenesulfonic acid were added, and the reaction was continued further for more than 3 hours. After the reaction mixture was cooled down to room temperature, filtered and dried to give an organic cyclic phosphorus compound referred to as HPC. M.p.=245° C.

The organic cyclic phosphorus-containing compound HPC (428 g) and epichlorohydrin (925 g) were placed into a glass reactor kettle, stirred and heated to a temperature of 55° C. 49.5 wt % aqueous solution of sodium hydroxide (153.5 g) was added to the mixture and reacted at that temperature for 5 hours under a reduced pressure. The resultant reaction mixture was heated under a vacuum to recover unreacted epichlorohydrin. After the temperature reached 155° C., the pressure was released. Water and methyl isobutyl ketone were added to the reaction mixture to effect the extraction. Aqueous phase was separated and the organic phase was evaporated to give 518 g of a phosphorus-containing epoxy resin of the present invention (referred to as CEP-280). The phosphorus-containing epoxy resin has an epoxy equivalent of 300 g/eq and a softening point of 95° C.

EXAMPLE 1 TO 7 AND COMPARATIVE EXAMPLE

In a kettle equipped with a mixer and a condenser, the above-synthesized phosphorus-containing epoxy resins, hardeners, hardening promoters, and solvents were formulated at room temperature according to the ratios shown in Table 1 into epoxy resin varnish.

TABLE 3

|  | Ex. 1 | Ex. 2 | Ex. 3 | Ex. 4 | Ex. 5 | Ex. 6 | Ex. 7 | Comp. Ex |
|---|---|---|---|---|---|---|---|---|
| Varnish Formulation | | | | | | | | |
| Phosphorus-Containing Epoxy Resin A (g) | 125 | | | | | | | |
| Phosphorus-Containing Epoxy Resin B (g) | | 125 | | | | | | |
| Phosphorus-Containing Epoxy Resin C (g) | | | | 125 | 125 | 125 | | |
| Phosphorus-Containing Epoxy Resin D (g) | | | 125 | | | | 125 | |
| Epoxy Resin 4 (g) | | | | | | | | 125 |
| Hardener A | 28.2 | 28.0 | 26.5 | | | | | 26.5 |
| Hardener B | | | | 31.8 | | | | |
| Hardener C | | | | | 28.3 | | 29.5 | |
| Hardener D | | | | | | 53.1 | | |
| Hardener Promoter B | 1.8 | 1.2 | 1.0 | 0.6 | 0.8 | 0.5 | 0.6 | 0.6 |

A glass fiber fabric was impregnated in the phosphorus-containing epoxy resin varnish formulated above and then dried at 190° C. for 120 minutes, so that prepregs were formed. The glass transition temperature was measured by DSC (Differential Scan Calorimeter, TA 2910) (the temperature ranged from 50 to 250° C., temperature elevating rate was 20° C./minutes), and the flame retardant property was measured by a flame test. The flame test was according to the method in UL 746. The prepreg was cut into 5 pieces of specimens with sizes of 12.5 mm×1.3 mm. Each specimen was set a flame twice. If the total time for ten flamings was not more than 50 seconds and each flaming was not more than 10 seconds, the prepreg passed the flame test. The results are shown in Table 4.

TABLE 4

|  | Example 1 | Example 2 | Example 3 | Example 4 | Example 5 | Example 6 | Example 7 | Comparative Example 1 |
|---|---|---|---|---|---|---|---|---|
| Average flame time (sec) | 2 to 3 | 0 to 1 | 0 to 1 | 2 to 3 | 2 to 3 | 1 to 2 | 2 to 3 | 1 to 2 |
| Tg (I) | 157 | 165 | 173 | 147 | 155 | 151 | 151 | 135 |

Eight pieces of prepregs were piled up. A sheet of 35 μm copper foil was placed on both the up and down sides, and was laminated at 185° C. under a pressure of 25 kg/cm² to form into a laminated entity of phosphorus-containing epoxy resin and glass fiber fabric. The physical properties of each laminated entity were analyzed, and the results are shown in Table 5.

TABLE 5

| Test Item | Condition and Spec | Example 1 | Example 4 | Example 7 | Comparative Example 1 |
|---|---|---|---|---|---|
| Flame Test | UL 94-VO | + | + | + | + |
| Solder Resistance | 288° C. spec. > 120 sec. | + | + | + | + |
| Peeling Strength | IPC spec. > 81 b/in | 11.2 | 11.2 | 10.9 | 11.1 |
| Surface Resistance | spec. > $10^{12}$ | $2.88 \times 10^{15}$ | $1.25 \times 10^{15}$ | $1.22 \times 10^{15}$ | $3.57 \times 10^{15}$ |
| Volume Resistance | spec. > $10^{10}$ | $1.25 \times 10^{14}$ | $0.97 \times 10^{14}$ | $0.88 \times 10^{14}$ | $1.06 \times 10^{14}$ |
| Dielectric Constant | IPC spec. < 5.4 | 4.7 | 4.7 | 4.8 | 4.7 |
| Dissipation Factor | — | 0.020 | 0.024 | 0.019 | 0.020 |

("+" means: passed)

EXAMPLE 8 TO 11 AND COMPARATIVE EXAMPLE 2

In a kettle equipped with a mixer and a condenser, the components according to the ratios shown in table 6 were formulated at room temperature into epoxy resin varnish.

TABLE 6

|  | Example 8 | Example 9 | Example 10 | Example 11 | Comparative Example 2 |
|---|---|---|---|---|---|
| Phosphorus-containing Epoxy Resin A(g) | 105 | | | | |
| Phosphorus-containing Epoxy Resin B(g) | | 150 | | | |
| Phosphorus-containing Epoxy Resin C(g) | | | 150 | | |
| Phosphorus-containing Epoxy Resin D(g) | | | | 150 | |
| Epoxy Resin 4 | | | | | 125 |
| Hardener A | 32.4 | 32.4 | 27.5 | 29.9 | 26.5 |
| Hardening Promoter B | 2.4 | 0.9 | 0.6 | 0.6 | 0.65 |

The resulting epoxy resin compositions from Example 3, 7, and 8 and Comparative Example 2 were coated at a thickness of 80 μm on the rough surface of the 18 μm copper foil, and dried in the oven at 170° C. The resulting epoxy resin coated copper foils were put on both the up and down sides of the prepregs formed from the epoxy resin composition of Example 1 mentioned above, after being pressed at 185° C. under a pressure of 25 kg/cm² yielding a multi-layer plate. The physical properties of said multi-layer plates were tested, and the results are shown as Table 7.

TABLE 7

| Test Item | Conditioned Spec. | Example 8 | Example 3 | Example 7 | Comparative Example 2 |
|---|---|---|---|---|---|
| Flame Test | UL 94-VO | + | + | + | + |
| Solder Resistance | IPC260° C. spec. > 30 sec. | + | + | + | + |
| Peeling Strength | IPC spec. > 6 lb/in (18 μm) | 7.6 | 7.4 | 8.0 | 8.4 |

("+" means "passed")

The invention claimed is:

1. A phosphorus-containing epoxy resin having the formula (A):

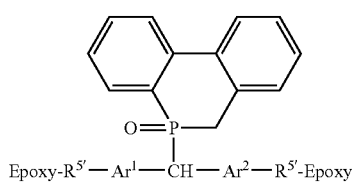

(A)

wherein $R^5$ is selected from —O—, —NH—, —S—, —COO—, —SO$_3$—, —CO—, and —CH$_3$CON< group; $Ar^1$ and $Ar^2$ are independently selected from the moieties as follows:

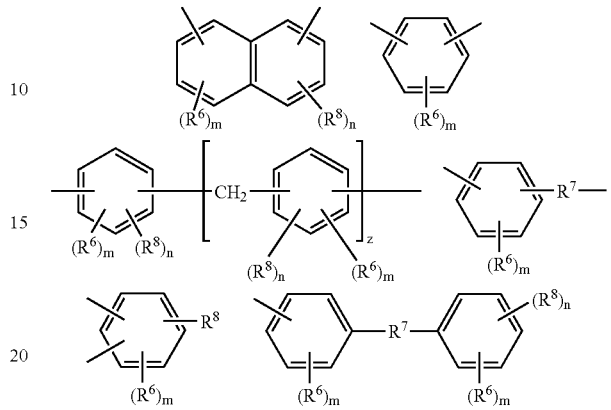

$R^6$ is H, $C_{1-10}$ alkyl or aryl; $R^7$ is —CH$_2$—, —(CH$_3$)$_2$C—, —SO$_2$—, —CO—, —O—; $R^8$ is —OH, —NH$_2$, —SH, —COOH, —SO$_3$H, —COH, or —NHCOCH$_3$; m and n are integers from 0 to 4; z is an integer from 1 to 20; Epoxy- is a group containing at least one epoxy group.

2. A method for producing the phosphorus-containing epoxy resin according to claim 1, which comprises the steps of addition reacting 9,10-dihydro-9-oxa-10-phosphaphenanthrene-10-oxide (HCA) represented by formula (C):

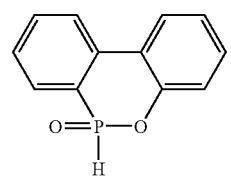

(C)

with compounds containing C═O reactive group to form a phosphorus-containing compound having an alcohol group, then condensation reacting with phenols and organic acids to yield the phosphorus-containing compound having the formula (B):

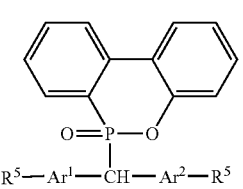

(B)

wherein $R^{5'}$ is a group selected from —OH, —NH$_2$, —SH, —COOH, —SO$_3$H, —COH, or —NHCOCH$_3$; $Ar^1$ and $Ar^2$ have the same definition of the groups described above; further reacting the resulting phosphorus-containing compound of formula (B) either with epoxy resin having at least two epoxy groups or with an epihalohydrin to form the phosphorus-containing epoxy resin according to claim 1.

3. The method according to claim 2, wherein the equivalent ratio of epoxy resin or epihalohydrin:phosphorus-containing compound is from 100:5 to 100:150.

4. The method according to claim 3, wherein the equivalent ratio of epoxy resin or epihalohydrin:phosphorus-containing compound is from 100:5 to 100:50.

5. The method according to claim 2, wherein the equivalent ratio of epoxy resin or epihalohydrin:phosphorus-containing compound is from 100:5 to 100:40.

6. A flame-retardant resin composition which comprises:
   (1) the phosphorus-containing epoxy resin according to claim 1,
   (2) a halogen-free hardener, which has a reactive hydrogen capable of reacting with the epoxy group in the epoxy resin, and
   (3) a hardening promoter.

7. The flame-retardant composition according to claim 6, wherein said (2) halogen-free hardener is a nitrogen- or phosphorus-containing compound, having a structure as presented by the formula (D):

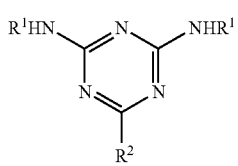

wherein $R^1$ is independently selected from the group consisting of hydrogen atom, formula $(E_1)$, and formula $(E_2)$, but at least one $R^1$ is not a hydrogen atom;

$(E_1)$ is $-[CH_2-R^3]_nH$, wherein $R^3$ is selected from the group consisting of phenylene, naphthylene, and a group of formula:

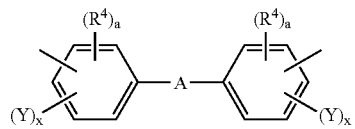

wherein A is selected from the group consisting of —O—, —S—, —SO$_2$—, —CO—, —CH$_2$—, —C(CH$_3$)$_2$—,

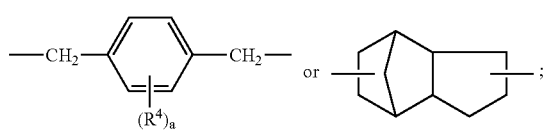

wherein $R^4$ is H, $C_{1-10}$ alkyl or aryl; Y is —OH, —NH$_2$, or —COOH; a is an integer of 0 to 2; x is an integer of 0 to 4; among the groups represented by $R^3$ and A described above, the aryl may be substituted by one or more substituents selected from the group consisting of hydroxy, amino, carboxy, and $C_6$ aliphatic groups; and $(E_2)$ is

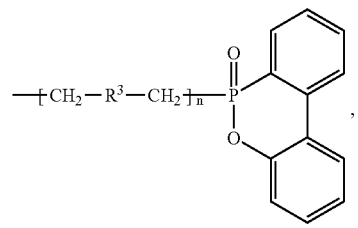

wherein $R^2$ is —NHR$^1$, $C_{1-6}$ alkyl or aryl; n is an integer of 0–20; the definitions of $R^3$ and n is formula $(E_2)$ are respectively the same as those in the above formula $(E_1)$.

8. The flame-retardant resin composition according to claim 6, further comprising a phosphorus-free epoxy resin which is selected from the group consisting of bisphenol glycidyl ether, bis(biphenyl glycidyl ethers), dihydroxybenzene glycidyl ethers, glycidyl ethers containing a nitrogen hetero ring, dihydrxynaphthalene glycidyl ethers, phenolics polyglycidyl ethers, polyhydroxyphenol polyglycidyl ethers.

9. The flame-retardant resin composition according to claim 6, wherein the content of the phosphorus-containing epoxy resin is from 5 to 100 wt %, based on the total weight of the epoxy resin.

10. The flame-retardant resin composition according to claim 9, wherein the content of the phosphorus-containing epoxy resin compound in the component (1) is from 20 to 100 wt %, based on the total weight of the epoxy resin.

11. The flame-retardant resin composition according to claim 10, wherein the content of the phosphorus-containing epoxy resin is from 5 to 100 wt %, based on the total weight of the epoxy resin.

12. The flame-retardant resin composition according to claim 6, wherein said hardener is selected from the group consisting of amines, bisphenol resins, dihydroxybenzene, polyhydroxyphenol resins, phenolics, and anhydrides.

13. The flame-retardant resin composition according to claim 6, wherein said hardening promotor is selected from the group consisting of tertiary amines, tertiary phosphines, quaternary ammonium salts, quaternary phosphonium salts, complex salts of boric trifluoride, and imidazole compounds.

14. The flame-retardant resin composition according to claim 6, wherein the amount of said hardener used is from 20 to 140 based on the reactive hydrogen equivalent weight, the reactice hydrogen equivalent weight of the epoxy resin being 100.

15. The flame-retardant resin composition according to claim 14, wherein the amount of said hardener used is from 50 to 95 based on the reactive hydrogen equivalent weight, the reactive hydrogen equivalent weight of the epoxy resin being 100.

16. The flame-retardant resin composition according to claim 6, wherein the amount of said hardener promotor used is from 50 to 50,000 ppm of the total weight of the epoxy resin composition.

17. The flame-retardant resin composition according to claim 16, wherein the amount of said hardener promotor used is from 100 to 30,000 ppm of the total weight of the epoxy resin composition.

18. The flame-retardant resin composition according to claim 17, wherein the amount of said hardener promotor used is from 500 to 5000 ppm of the total weight of the epoxy resin composition.

19. The flame-retardant resin composition according to any one of claims 6, 7 or 8 to 18, which is used in the manufacture of adhesive plates, composite materials, laminated plates, printed circuit boards, substrates for build-up process, copper foil adhesives, and IC packages.

20. A hardened articles, which is obtained by hardening the flame-retardant retardant resin composition according to any one of claims 6, 7, or 8 to 18 at the temperature range from 20 to 350° C.

* * * * *